United States Patent
Ito

(10) Patent No.: US 7,733,632 B2
(45) Date of Patent: Jun. 8, 2010

(54) VEHICLE-MOUNTED ELECTRICAL JUNCTION BOX

(75) Inventor: Katsuya Ito, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 94 days.

(21) Appl. No.: 12/010,158

(22) Filed: Jan. 22, 2008

(65) Prior Publication Data

US 2008/0247133 A1    Oct. 9, 2008

(30) Foreign Application Priority Data

Jan. 23, 2007    (JP)    ............... 2007-013004

(51) Int. Cl.
   *H02B 1/26*    (2006.01)
   *H05K 1/00*    (2006.01)
(52) U.S. Cl. ............... 361/626; 361/622; 361/624; 361/676; 174/520; 174/526; 439/76.2
(58) Field of Classification Search ............... 361/622, 361/624, 626, 676; 165/80.3, 185; 174/50, 174/520, 526; 439/34, 76.1–76.2
See application file for complete search history.

(56) References Cited

U.S. PATENT DOCUMENTS

| | | | | |
|---|---|---|---|---|
| 5,703,757 | A * | 12/1997 | Hayes et al. ............... | 361/752 |
| 6,511,331 | B2 * | 1/2003 | Saito et al. ............... | 439/76.2 |
| 6,514,091 | B2 * | 2/2003 | Saito et al. ............... | 439/76.2 |
| 6,835,073 | B2 * | 12/2004 | Kobayashi ............... | 439/76.2 |
| 6,905,347 | B2 * | 6/2005 | Kobayashi ............... | 439/76.2 |
| 7,186,120 | B2 | 3/2007 | Saka | |
| 7,544,065 | B2 * | 6/2009 | Ito ............... | 439/76.2 |
| 7,616,438 | B2 * | 11/2009 | Shimizu et al. ............ | 361/694 |

FOREIGN PATENT DOCUMENTS

| | | |
|---|---|---|
| JP | A 2001-203306 | 7/2001 |
| JP | A 2005-20798 | 1/2005 |
| JP | A 2005-302330 | 10/2005 |
| JP | A 2006-6079 | 1/2006 |

* cited by examiner

*Primary Examiner*—Jayprakash N Gandhi
*Assistant Examiner*—Robert J Hoffberg
(74) *Attorney, Agent, or Firm*—Oliff & Berridge, PLC

(57) ABSTRACT

A casing includes a first casing member and a second casing member. The first casing member is provided on a side with a fuse module mounting section having a side opening. The second casing member is provided on the same side as the first casing member with a relay module mounting section having a side opening and extending downward. An ECU mounting frame extends from a bottom wall of the second casing member. An ECU is disposed on a second side of a bottom wall of the second casing member and in parallel with the relay module mounting section. A fuse module is attached to the fuse module mounting section to receive fuses. A relay module is attached to the relay module mounting section to receive relays. The fuse module and relay module that generate heat are disposed on a side of the casing in a vertical direction.

6 Claims, 6 Drawing Sheets

_US 7,733,632 B2_

VEHICLE-MOUNTED ELECTRICAL JUNCTION BOX

This application claims priority from Japanese Patent Application No. 2007-013004 filed in the Japanese Patent Office on Jan. 23, 2007, the disclosure of which is incorporated herein by reference in its entirety.

BACKGROUND

This invention relates to a vehicle-mounted electrical junction box and more particularly relates to a vehicle-mounted electrical junction box that can reduce heat generation in a circuit board and downsize the circuit board by intensively arranging relays and fuses, which are mounted on embodiments of an electrical junction box and are heat-generating parts, near a side of the circuit board to simplify an internal circuit.

Generally, a number of relays and fuses are mounted on an electrical junction box that distributes electrical power to electrical devices mounted on a motor vehicle, such as an automobile.

FIG. 5 shows an example of electrical junction box disclosed in JP 2005-302330A. The electrical junction box 1 includes a casing comprising a first casing member 2 and a second casing member 3. A relay module 4 is disposed on a central position in the casing. A fuse module 5 and connector modules 6, 7 are disposed on an outer peripheral position of the casing to surround the relay module 4. An electric control unit ("ECU") 8 is disposed on the central position of the casing above the relay module 4 while an internal circuit body 9 is disposed below the relay module 4.

In the electrical junction box 1 of JP 2005-302330A, a circuit interposing the relays and fuses distributes an electrical current, which is applied from the connector module 6 to an external circuit via the relay module 4, the fuse module 5, and the internal circuit body 9 (or the ECU 8). Because the circuit extends between the central and outer peripheral positions of the casing in order to interpose the relays and fuses, the circuit extends for a long distance, the amount of heat generated increases, and the size of the circuit board required is increased.

Additionally, because the relay module 4 is disposed between the ECU 8 and the internal circuit body 9 in a vertical direction, generated heat is likely to accumulate in the casing, and consequently the interior of the casing tends to overheat.

Furthermore, another drawback of the conventional electrical box is inefficient use of space. For example, as shown in FIG. 6, first and second spaces S, which are above and below the fuse module 5 disposed on the outer peripheral position of the casing, become dead spaces, thereby increasing the size of the conventional electrical junction box.

SUMMARY

In view of the above problems, an object of exemplary embodiments of the present invention is to reduce heat generation in a circuit board and downsize the circuit board in order to reduce the size of an electrical junction box. The internal circuit is simplified by arranging relays and fuses, which intensively generate heat, on a side of the circuit board.

In order to overcome the above problems, embodiments of the present invention provide a vehicle-mounted electrical junction box. The vehicle-mounted electrical junction box comprises a casing, a circuit board, a fuse module, a relay module, fuses, relays, connectors, and an ECU. The casing includes a first casing member and a second casing member. The circuit board is disposed in the casing. The fuse module receives the fuses and is disposed near a side end of the circuit board. The relay module receives the relays and is disposed near the side end of the circuit board. The fuse and relay modules are directed substantially perpendicularly to the side end of the circuit board. The relays and connectors are mounted on a first surface of the circuit board and the ECU is mounted on a second surface of the circuit board.

In some exemplary embodiments, the casing comprising the first and second casing members has a substantially flat and rectangular hollow interior. Only the circuit board is contained in substantially the whole interior. Since the fuse and relay modules, which receive the fuses and relays that generate heat, are disposed on the side of the casing, it is possible to suppress overheating in the casing and reduce heat influence to the circuit board in the casing.

Also, because the relays are received in the relay module, it is possible to reduce the number of the relays to be mounted on the circuit board in the casing, thereby downsizing the circuit board.

The first casing member is provided on a side with a fuse module mounting section having a side opening. A second casing member is provided on the same side as the first casing member with a relay module mounting section. The casing is formed by assembling the first and second casing members. The relays and connectors mounted on the circuit board are inserted into containing sections in the first casing member. An ECU mounting frame projects from a bottom wall of the second casing member. The ECU is disposed on a second surface of the bottom wall of the second casing member in parallel with the relay module mounting section. The fuse module is attached to the fuse module mounting section. The relay module is attached to the relay module mounting section. The fuse and relay modules are arranged on a side of the casing in a vertical direction. The fuse module is disposed on a slant above the circuit board. The relay module is disposed on a slant below the circuit board.

According to the above construction, because the fuse module is disposed on a slant above the circuit board; the relays and connectors mounted on the fuse module and circuit board are disposed in parallel to one another; the relay module is disposed on a slant below the circuit board; and the relay module and the ECU disposed on the second surface of the circuit board are arranged in parallel with each other. Thus, it is possible to efficiently arrange the respective members by creating little or no dead space, thereby reducing the size of embodiments of an electrical junction box.

Also, preferably, an amount of projecting the fuse module upward with respect to the circuit board is substantially the same as that of projecting the relay module downward with respect to the circuit board and the fuse. Thus, the fuse and relay modules are substantially equally spaced away from each other with respect to circuit board. This will enable desired parts to be effectively arranged in the spaces that are defined equally above and below the circuit board.

A power source bus bar is disposed to bridge the fuse and relay modules and the circuit board. The power source bus bar is provided with power source connecting terminal portions for connecting a power source terminal on a distal end of a power source line to the power source bus bar. The power source bus bar is connected through a bus bar of the relay module to input terminals of the relays, to input terminals of some of the fuses to be attached to the fuse module, and to conductors of the circuit board.

As described above, it is possible for embodiments of an electrical junction box to efficiently form: the first power source circuit for conducting the electrical current to the power source bus bar, the bus bar in the relay module, the relays, the fuses, and the conductors of the circuit board; the second power source circuit for conducting the electrical current to the power source bus bar, the fuses, and the conductors of the circuit board; and the third power source circuit for conducting the electrical current to the power source bus bar, the conductors of the circuit board, and the fuses mounted on the circuit board, since the power source bus bar bridges the fuse and relay modules, and the circuit board, which is arranged in the vertical direction. Because the power source bus bar is directly connected to the bus bar in the relay module, it is not necessary to connect the power source bus bar through the conductors of the circuit board to the relays and fuses. As a result, it is possible to reduce the number of the conductors of the circuit board and downsize the first and second casing members, as well as the circuit board.

It is also possible to simplify and shorten the circuit between the relays and the fuses and to reduce heat generation in the circuit board, since the fuse and relay modules are disposed in the vertical direction, and the circuit for connecting the output terminals of the relays to the input terminals of the relays is completed between the fuse and relay modules without interposing the conductors of the circuit board.

The relay module includes an L-shaped heat radiation plate disposed on the side opening in the relay module mounting section, a first bus bar to be connected to input terminals of the relays as a bus bar for the relay module, and a second bus bar to be connected to output terminals of the relays as a bus bar for the relay module. The first bus bar includes a vertical portion and a horizontal portion that extends from a second end of the vertical portion. A first end of the vertical portion is welded to the power source bus bar. The horizontal portion is adhered to a horizontal surface of a second end of the heat radiation plate. Terminal portions to be connected to the input terminals of the relays extend in a vertical direction from an outer side edge of the horizontal portion and are spaced away from one another. The second bus bar is provided on a second end with terminal portions to be connected to the output terminals of the relays and on a first end with terminal portions to be connected to the input terminals of the fuses. The fuse module includes a fuse casing provided with fuse containing sections that are juxtaposed in a horizontal direction and are stacked in a plurality of layers in the vertical direction, and a fuse output side bus bar to be connected to the conductors of the circuit board and to be connected to the output terminals of the fuses when the output terminals of the fuses are inserted into the fuse containing sections.

The power source bus bar is formed into a bent shape. The power source bus bar has a first side provided with connecting portions to be connected to the input terminals of some of the fuses, a second side provided with terminal portions to be connected to the power source connecting terminal portions and the fusible links, and a third side of an intermediate position provided with connecting portions to be welded to the power source connecting portions of the first bus bar. The power source bus bar is arranged to cover the fuse output side bus bar.

The first power source circuit is formed, for example, by the power source bus bar, the first bus bar, the relays, the second bus bar, the fuses, the fuse output side bus bar, and the conductors of the circuit board.

The second power source circuit is formed, for example, by the power source bus bar, the fuses, the fuse output side bus bar, and the conductors of the circuit board.

Thus, when the power source bus bar is connected through the relays and/or the fuses to the conductors of the circuit board, it is possible to minimize the number of the conductors of the circuit board because the power source bus bar is directly connected to the relays and/or the fuses without bypassing the conductors of the circuit board.

It is also possible to efficiently radiate the heat generated in the relays outward, to prevent the heat from accumulating in the casing, and to prevent the temperature from rapidly increasing in the casing, since the relay module mounting section that receives the relay module is provided with the side opening, the heat radiation plate is opposed to the side opening, and the portions to be connected to the input and output terminals of the first and second bus bars are adhered to the inner surface of the heat radiation plate. The bus bars may be adhered to the heat radiation plate through the insulation adhesive.

As described above, according to an exemplary embodiment of the present invention, it is possible to decrease the size of the casing comprising the first and second casing members, since only the circuit board is contained in the casing. It is also possible to suppress overheating in the casing, since the fuse module and relay module are attached to the fuse module mounting section and relay module mounting section provided on the side of the first and second casing members, respectively, and the heat generating members are intensively disposed on the side of the outer peripheral position of the casing. It is also possible to effectively utilize the first and second spaces, thereby reducing the size of embodiments of an electrical junction box, since the fuse and relay modules are disposed on the side of the casing in the vertical direction.

Furthermore, it is possible to reduce the number of the conductors of the circuit board, to downsize the circuit board, and to reduce the heat generation in the circuit board, since the power source bus bar is directly connected to the bus bars in the modules, and the connecting circuit of the fuses and relays is completed between the modules without interposing the conductors of the circuit board.

DETAILED DESCRIPTION OF EXEMPLARY EMBODIMENTS

Figure 1:
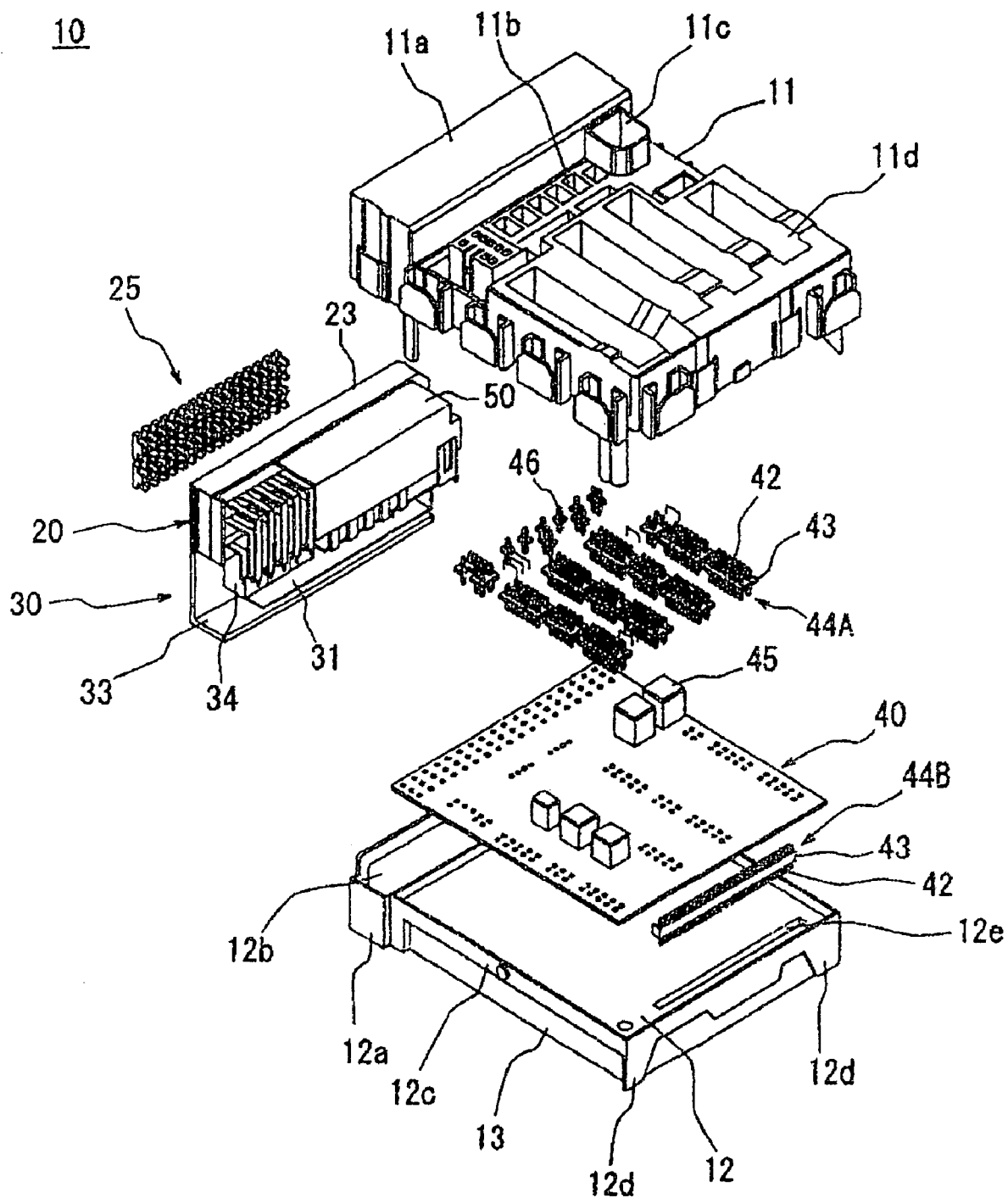
FIG. 1 is an exploded perspective view of an embodiment of an electrical junction box.

An exemplary embodiment of a vehicle-mounted electrical junction box will be described below by referring to the drawings, in which like numerals indicate like parts.

FIGS. 1 to 4 show an exemplary embodiment of an electrical junction box. An exemplary electrical junction box 10 includes a casing having a first casing member 11 and a second casing member 12, a fuse module 20, a relay module 30, a printed board (circuit board) 40, and an ECU 13. The modules 20 and 30 that act as heat generation members are disposed on an inside wall of the casing in a vertical direction. The printed board 40 is disposed on the other inside wall of the casing in a horizontal direction. The ECU 13 is disposed on a wall of the second casing member 12.

As shown in FIG. 1, a fuse module mounting section 11a is provided in a side wall with a side opening (not shown) and extends upward from a side wall of the first casing member 11. A relay module mounting section 12a is provided in a side wall with a side opening 12b and extends downward from a side wall of the second casing member 12 at the same side as the first casing member 11. ECU mounting frames 12d extend downward from corners of a bottom wall 12c of the second casing member 12.

The fuse module 20 is attached to the fuse module mounting section 11a while the relay module 30 is attached to the relay module mounting section 12a. The printed board 40 is disposed on a first surface of the bottom wall 12c of the second casing member 12, while the ECU 13 is attached to the ECU mounting frames 12d on a second surface of the bottom wall 12c.

Figure 2:
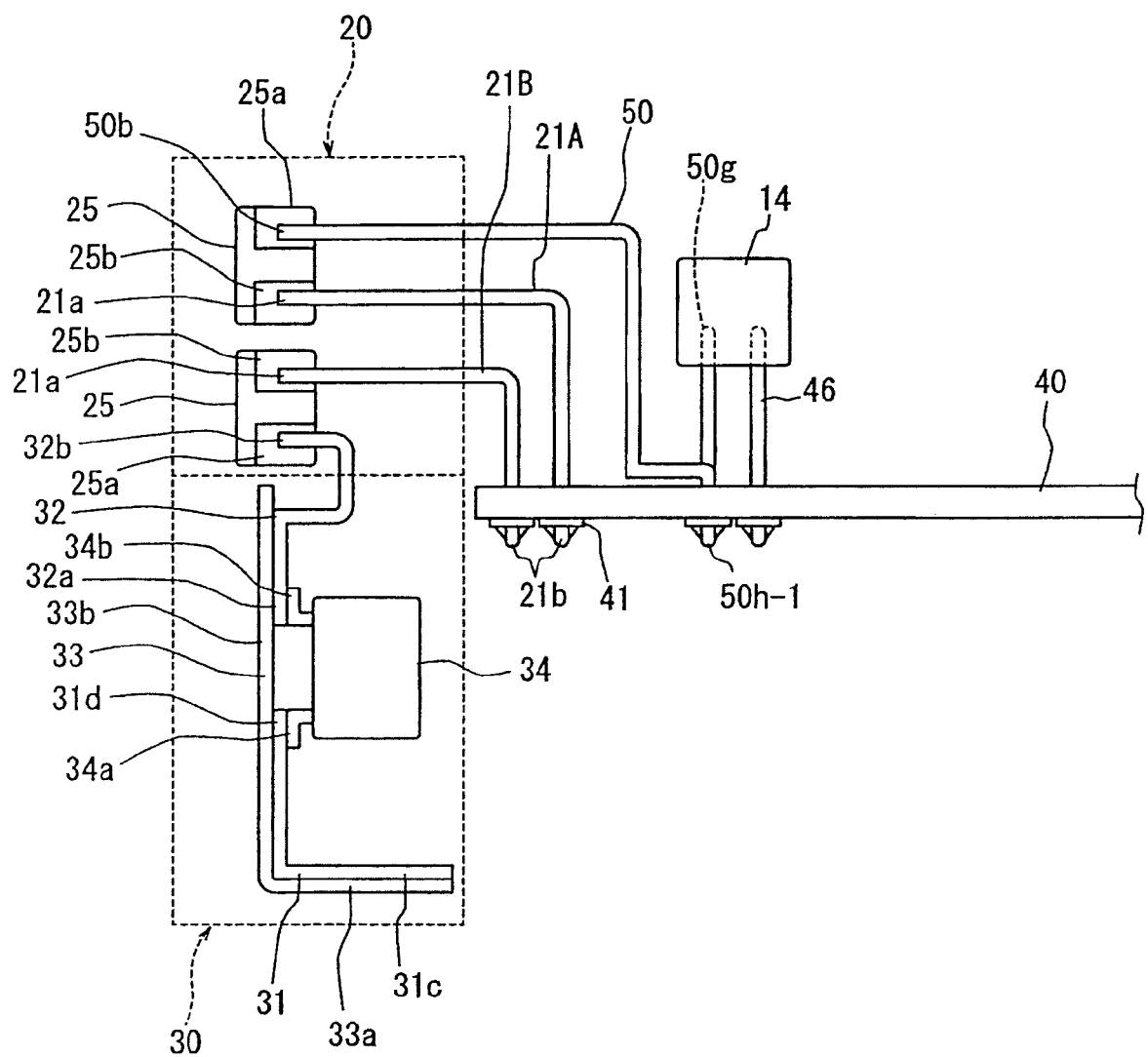
FIG. 2 is a schematic side elevation view of a part of the electrical junction box shown in FIG. 1, illustrating a relationship in arrangement among a fuse module, a relay module, and a printed board.

Thus, as shown in FIG. 2, the fuse module 20 and relay module 30 are arranged in the vertical direction. The fuse module 20 is arranged on a slant above the printed board 40 while the relay module 30 is arranged on a slant below the printed board 40. Devices mounted on the fuse module 20 and printed board 40 are arranged in parallel with one another. The relay module 30 and the ECU 13 are disposed in parallel with each other. An amount of the fuse module 20 projecting upward from the printed board 40 is substantially the same as an amount of the relay module 30 projecting downward from the printed board 40 so that the fuse module 20 and relay module 30 are substantially equally separated from each other with respect to the printed board 40 in the vertical direction.

A power source bus bar 50, to which a power source line (not shown) is connected, is disposed on a space between the stacked fuse and relay modules 20 and 30 and the printed board 40.

Figure 3:
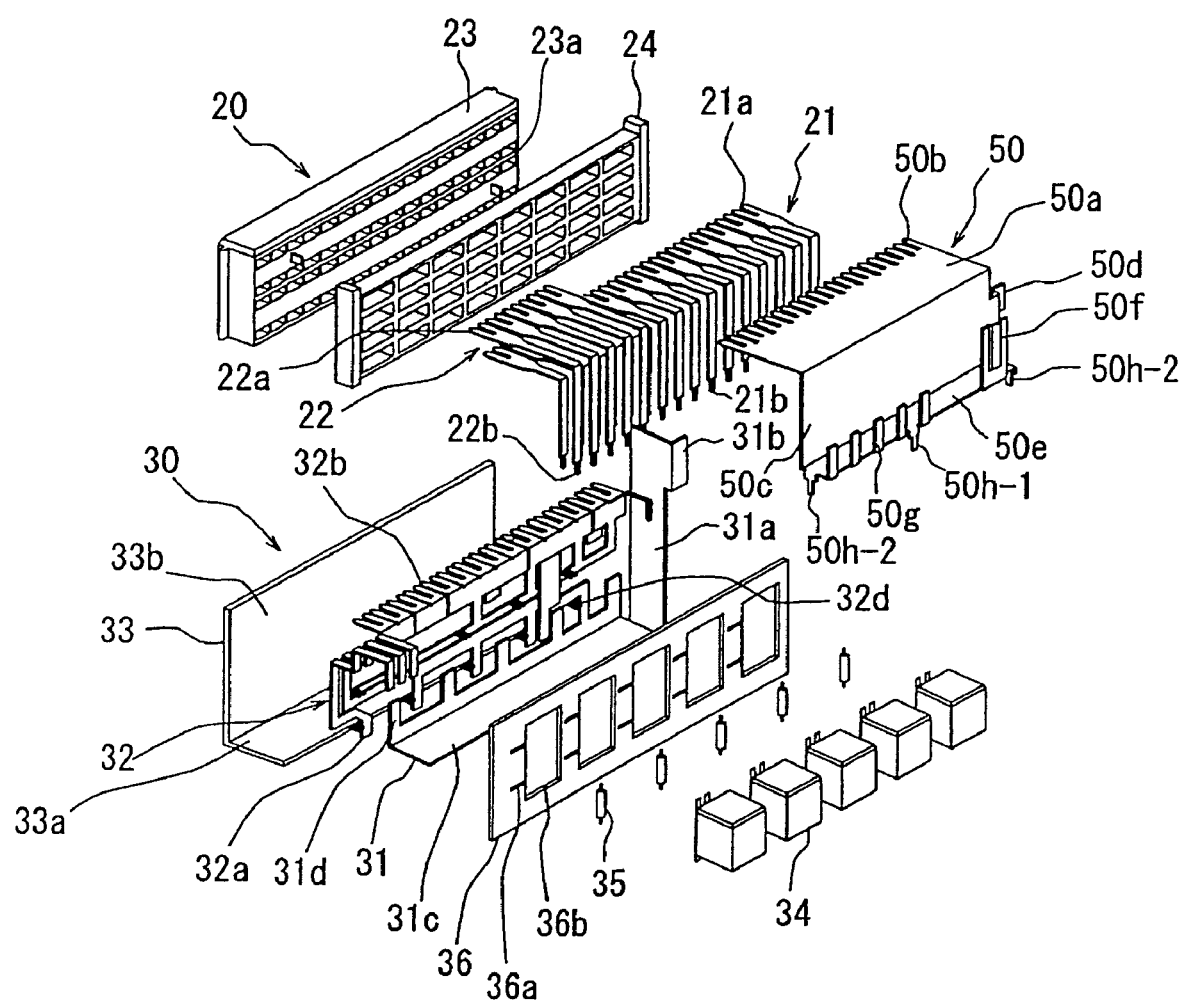
FIG. 3 is an exploded perspective view of a fuse module and relay module.

As shown in FIG. 3, the relay module 30 includes a first bus bar 31 that defines mainly a circuit extending from the power source bus bar 50 to inputs of the relays 34, and a second bus bar 32 that defines mainly a circuit extending from outputs of the relays 34 to inputs of fuses 25. The fuse module 20 includes a fuse output side bus bar 21 that defines a circuit extending from outputs of the fuses 25 to the printed board 40.

The bus bar 50 can have a substantially L-shaped configuration in cross section and is provided with a first horizontal portion 50a, a plurality of tuning fork-like terminal portions 50b, a vertical portion 50c, a connecting portion 50d, and a second horizontal portion 50e. The terminal portions 50b are formed on an outer end edge of the first horizontal portion 50a and are connected to input terminals 25a of the fuses 25. The vertical portion 50c extends downward from an inner end edge of the first horizontal portion 50a. The vertical portion 50c is provided on a side with the connecting portion 50d to be connected to the first bus bar 31 and is provided on a second end with the second horizontal portion 50e that extends in an opposite direction from the first horizontal portion 50a. The second horizontal portion 50e is provided on an inner end edge with a tab-like power source connecting terminal portion 50f to be connected to a power source terminal of a distal end of the power source line and with a plurality of tab-like terminal portions 50g to be connected to input terminals of fusible links 14 to be contained in a fusible link containing section 11b in the first casing member 11. The portions 50f and 50g extend downward from the second horizontal portion 50e. Pin-like terminal portions 50h extend downward from the second horizontal portion 50e. An intermediate pin-like terminal portion 50h-1 is connected to a conductor 41 of the printed board 40 while opposite pin-like terminal portions 50h-2 are not connected to the conductor 41 and serve as positioning and fixing elements.

The first bus bar 31 can be formed into a substantially L-shaped configuration in cross section and includes a vertical portion 31a and a power source connecting portion 31b provided on a first end of the vertical portion 31a. The power source connecting portion 31b is attached to the connecting portion 50d of the power source bus bar 50. The vertical portion 31a of the first bus bar 31 is disposed in a space enclosed by the first horizontal portion 50a and vertical portion 50c of the power source bus bar 50. Tab-like terminal portions 31d to be connected to input terminals 34a of the relays 34 extend upward and are spaced away from one another along the outer end edge of the horizontal portion 31c extending from the second end of the vertical portion 31a.

A surface of the horizontal portion 31c of the first bus bar 31 is adhered through an insulative adhesive to a second end horizontal surface 33a of an aluminum heat radiation plate 33 having a substantially L-shaped configuration in cross section. A vertical portion 33b extends upward from an outer end edge of the second end horizontal surface 33a of the heat radiation plate 33 and is opposed to the opening 12b in the side wall of the second casing member 12. The terminal portion 31d of the first bus bar 31 is attached, for example through an insulative adhesion, to an inner surface of the vertical portion 33b.

The second bus bars 32 are disposed in a vertical direction and are attached, for example through an insulative adhesion, to an inner surface of the vertical portion 33b of the heat radiation plate 33. The second bus bar 32 is provided on a second end with tab-like terminal portions 32a to be connected to output terminals 34b of the relays 34 and is provided on a first end with tuning-fork-like terminal portions 32b to be connected to input terminals 25a of the fuses 25.

The second bus bar 32 is provided with a plurality of press-contact tabs 32d to be connected to terminals of resistors 35. The press-contact tabs 32d are inserted into terminal holes 36a in a sheet of insulation plate 36, respectively. A plurality of second bus bars 32 are positioned by the insulation plate 36. The insulation plate 36 is provided with a plurality of rectangular openings 36b spaced away from one another in a longitudinal direction (horizontal direction). An input terminal 34a of each relay 34 is attached (for example, by soldering) through the opening 36b to the terminal portion 31d of the first bus bar 31. An output terminal 34b of each relay 34 is attached to the terminal portion 32a of the second bus bar 32. These relays 34 are directed laterally and disposed toward the interior of the casing.

The fuse output side bus bar 21 is provided on one end with tuning-fork-like terminal portions 21a to be connected to output terminals 25b of the fuses 25 and is provided on the other end with pin-like terminal portions 21b to be connected to the conductors 41 of the printed board 40. The fuse output side bus bar 21 is formed into a substantially L-shaped configuration in cross section. As shown in FIG. 2, the fuse output side bus bars 21 are disposed in two layers and are covered by the power source bus bar 50.

A fuse input side bus bar 22 having a length greater than that of the fuse output side bus bar 21 is also provided. The fuse input side bus bar 22 is provided on one end with tuning-fork-like terminal portions 22a to be connected to input terminals 25a of the fuses 25 and on the other end with pin-like terminal portions 22b to be connected to the conductors 41 of the printed board 40. The fuse input side bus bar 22 is formed into a substantially L-shaped configuration in cross section and is arranged in parallel with the power source bus bar 50.

A fuse casing 23 that constitutes the fuse module 20 is opposed to the side opening in the fuse module mounting section 11a of the first casing member 11 and includes fuse containing sections 23a that are arranged in parallel with each other in at least two layers in the vertical direction.

The fuse casing 23 is provided on an inner side with base 24 to position a bus bar when the terminal portions of the bus bar are inserted into the fuse containing section 23a.

Figure 4:
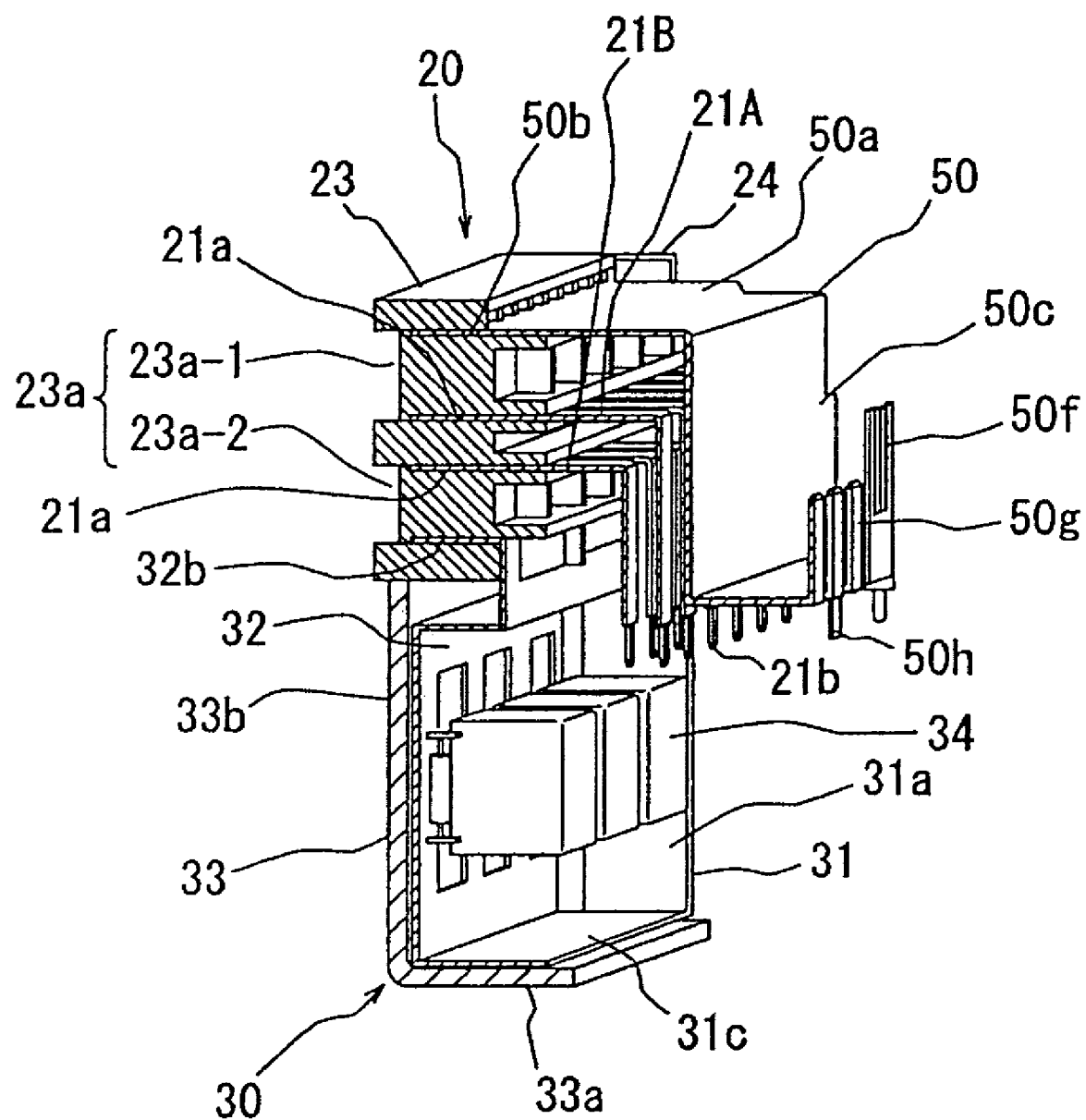
FIG. 4 is a perspective cross section view of a fuse module and relay module, illustrating a position in which the modules are coupled to each other.
Figure 5:
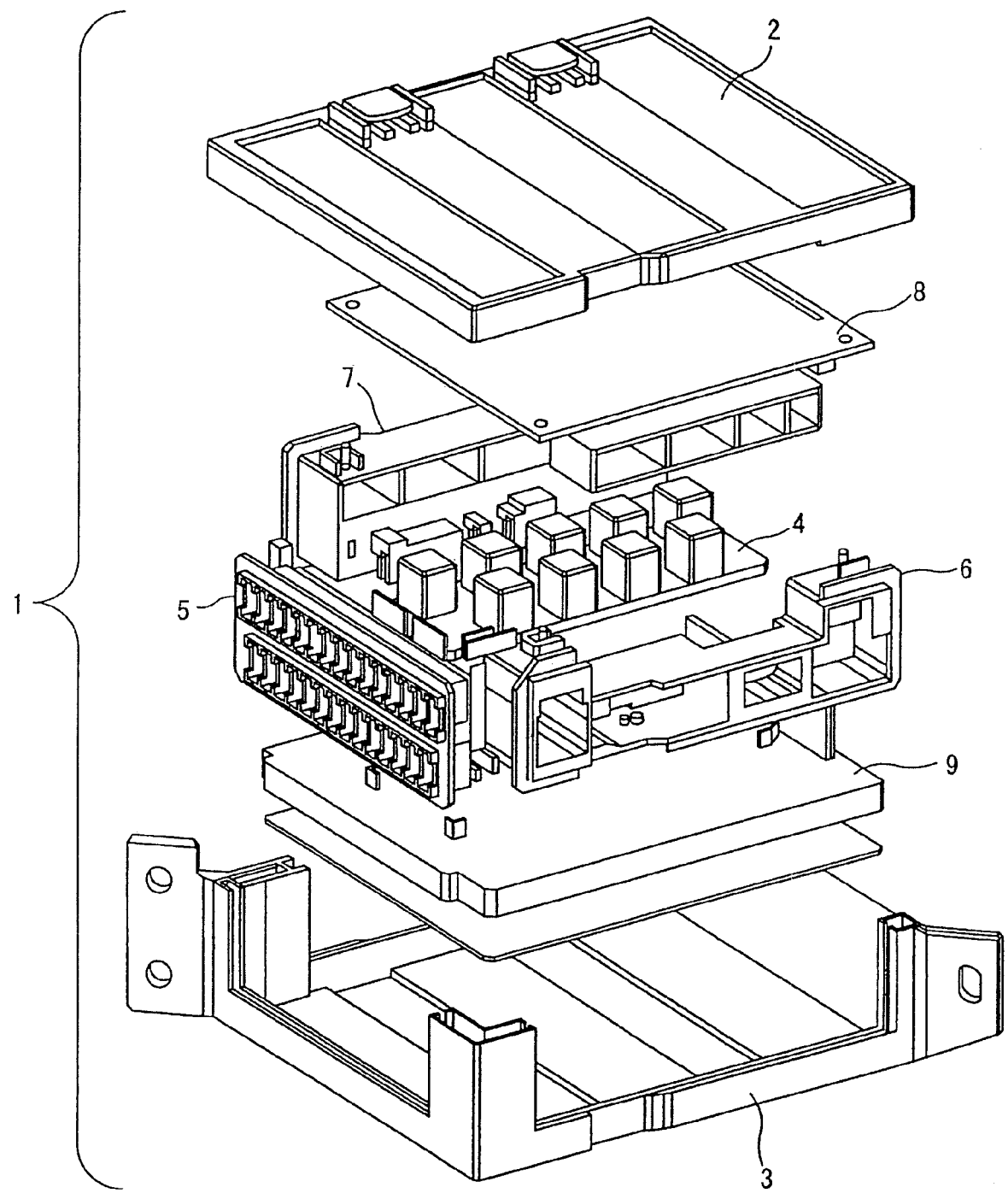
FIG. 5 is an exploded perspective view of a prior art electrical junction box.
Figure 6:
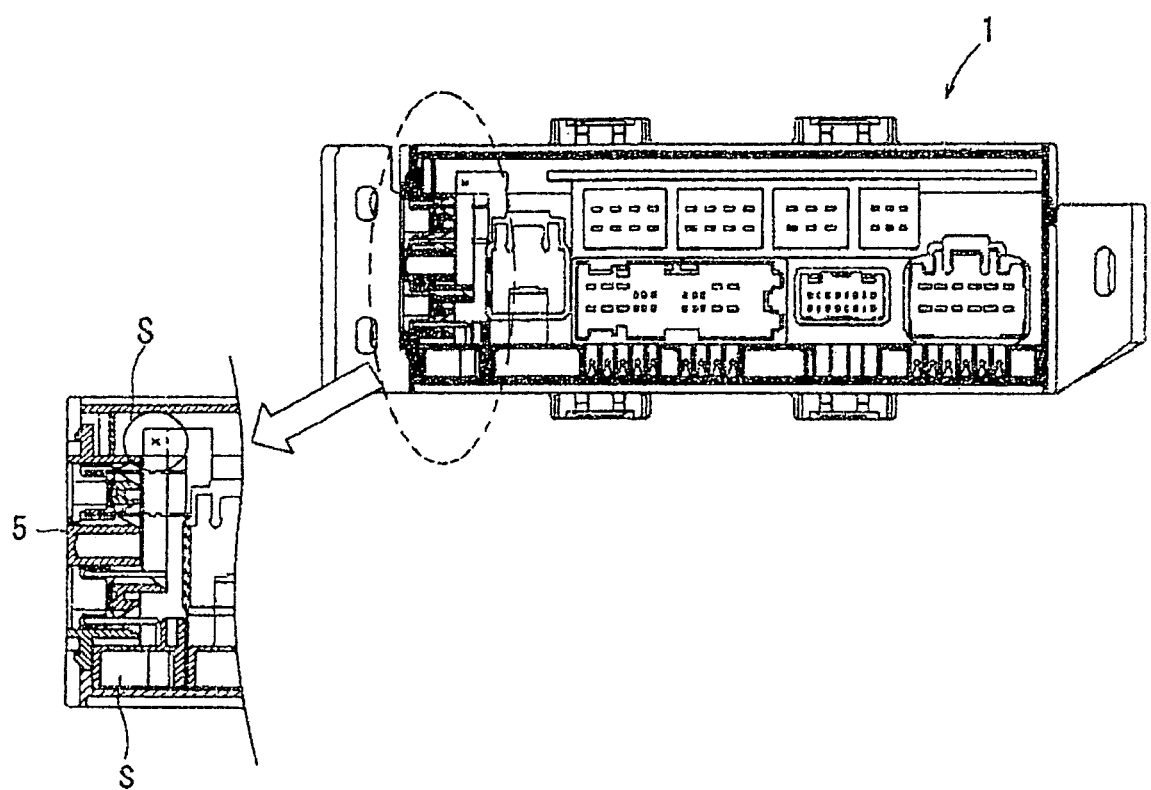
FIG. 6 is a side elevation view of the prior art electrical junction box shown in FIG. 5, illustrating a problem in the box.

As shown in FIG. 4, the terminal portions 50b of the power source bus bar 50 are inserted into the input terminals of some of the fuse containing sections 23a-1 on the first layer of the fuse casing 23. The terminal portions 22a of the fuse input side bus bar 22 are inserted into the input terminals of the other fuse containing sections 23a-1. The terminal portions 22a are therefore connected to 23a-1 (not shown). These terminal portions 50b and 22a are connected to the input terminals 25a of the fuses 25, respectively.

Also, terminal portions 21a of a fuse output side bus bar 21A on a first layer are inserted into output terminals of the fuse containing sections 23a-1 on the first layer. The terminal portions 21a are connected to the output terminals 25b of the fuses.

On the other hand, terminal portions 32b of the second bus bar 32 are inserted into the input terminals of the fuse containing sections 23a-2 on the second layer in the fuse casing 23 to connect the terminal portions 32b to the input terminals 25a of the fuses 25.

Also, the terminal portions 21a of a fuse output side bus bar 21B on the second layer are inserted into the output terminals of the fuse containing sections 23a-2 on the second layer in the fuse casing 23 to connect the terminal portions 21a to the output terminals 25b of the fuses 25.

The terminal portion 50h-1 of the power source bus bar 50, the fuse output side bus bar 21 which is connected to the terminals of the fuses 25 at an end, and the terminal portions 21b and 22b on the other end of the fuse input side bus bar 22 are attached to the conductors 41 of the printed board 40.

Furthermore, a power source connecting terminal portion 50f of the power source bus bar 50 projects into the connector containing section 11c of the first casing member 11. The power source connecting terminal portion 50f is connected to a power source terminal (not shown) on the distal end of the power source line to be connected through a connector to the connector containing section 11c. Terminal portions 50g of the power source bus bar 50 project in the fusible link containing section 11b of the first casing member 11. The terminal portions 50g are connected to input terminals of fusible links 14 accommodated in the fusible link containing section 11b.

On the other hand, connectors 44A and 44B that hold a plurality of connecting terminals 42 through bases 43 for terminals are mounted on top and bottom surfaces of the printed board 40. Ends of the connector connecting terminals 42 are attached to the conductors 41 of the printed board 40. The other ends of the connector connecting terminals 42 project in the connector containing sections 11d and 12e provided in the second casing member 12 and first casing member 11, respectively. The conductors 41 of the printed board 40 are connected through the connectors 44A mounted on the top surface of the printed board 40 to an external circuit and are connected through the connectors 44B mounted on the bottom surface of the printed board 40 to the ECU 13.

Relays 45 and fusible link connecting terminals 46 are mounted on the top surface of the printed board 40. Ends of the fusible link connecting terminals 46 are attached to the conductors 41 of the printed board 40. The other ends of the fusible link connecting terminals 46 project in the fusible link connecting section 11b to be connected to output terminals of the fusible links 14.

The relays 45 to be mounted on the printed board 40 are relays for electrical devices such as, for example, a power window and the like that operates intermittently. The relays 34 of the relay module 30 are relays for electrical devices such as a radio set and the like that operates continuously for a long period in time.

Next, a circuit including the fuse module 20, the relay module 30, and the printed board 40 will be explained below.

A first power source circuit interposing the relays 34 of the relay module 30 and the fuses 25 of the fuse module 20 comprises the power source bus bar 50, the first bus bar 31, the relays 34, the second bus bar 32, the fuses 25, the fuse output side bus bar 21b and the conductors 41 of the printed board 40. The first power source circuit is connected through the connectors 44A to an external circuit.

A second power source circuit interposing only the fuses 25 of the fuse module 20 comprises the power source bus bar 50, the fuses 25, the fuse output side bus bar 21a, and the conductors 41 of the printed board 40. The second power source circuit is connected through the connectors 44A to an external circuit.

A third power source circuit not interposing the relays 34 of the relay module 30 and the fuses 25 of the fuse module 20 comprises the power source bus bar 50, the fusible links 14, the fusible link connecting terminals 46, and the conductors 41 of the printed board 40. The third power source circuit is connected through the connectors 44A to an external circuit.

Although these circuits are interposing the relays 45, other electrical devices (not shown) may be mounted on the printed board 40, and the ECU 13.

Thus, in the majority of circuits out of the internal circuits in embodiments of an electrical junction box 10, the circuit including the conductors 41 of the printed board 40 is disposed downstream from the circuits interposing the fuse module 20 and relay module 30. The number of the conductors 41 of the printed board 40 is reduced so that the circuits do not extend between the printed board 40 and the relay module 30.

A circuit including the fuse input side bus bar 22 to be connected to the input terminals 25a of the fuses 25 comprises the conductors 41 of the printed board 40, the fuse input side bus bar 22, the fuses 25, the fuse output side busbar 21a, and the conductors 41 of the printed board 40 in order.

According to the above construction, the printed board 40 is disposed on the central position in the casing while the fuse module 20 and relay module 30 are disposed on one side in the casing. The circuit between the relays 34 and the fuses 25 is shortened. Consequently, since the circuit interposing the relays 34 and fuses 25 does not extend between the central position and the outer peripheral position in the casing, it is possible to reduce heat generation in the printed board 40.

Since the relays 34 are disposed on the outer peripheral position in the casing, it is possible to reduce the number of the relays to be mounted on the printed board 40. Since it is not necessary to provide the circuit between the relays and the fuses on the printed board 40, it is possible to downsize embodiments of an electrical junction box 10 as well as the printed board 40.

In addition, since the relays 34 of the relay module 30 is disposed on one side of the casing, the heat radiation plate 33 is provided near the relays 34, and the heat radiation plate 33 is opposed to the side opening 12b in the second casing member 12, it is possible to readily radiate the heat generated in the relay module 30 without accumulating the heat in the casing.

What is claimed is:

1. A vehicle-mounted electrical junction box comprising:
a casing;
a circuit board;
a fuse module;
a relay module;
fuses;
relays;
connectors; and
an ECU,
wherein:
the casing includes a first casing member and a second casing member,
the circuit board is disposed in the casing,
the fuse module receives the fuses and is disposed near a side end of the circuit board,
the relay module receives some of the relays and is disposed near the side end of the circuit board, such that the fuse module and the relay module are arranged side-by-side,
the fuse module and the relay module are arranged perpendicularly to first and second surfaces of the circuit board respectfully; and
others of the relays and connectors are mounted on the first surface of the circuit board and the ECU is disposed on the second surface of the circuit board,
wherein the first casing member is provided with a fuse module mounting section and the second casing member is provided with a relay module mounting section, and the fuse module is attached to the fuse module mounting section and the relay module is attached to the relay module mounting section.

2. The vehicle-mounted electrical junction box according to claim 1,
wherein the casing is formed by assembling the first and second casing members, and the other of the relays and connectors mounted on the circuit board are inserted into containing sections in the first casing member;
the relay module mounting section and the fuse module mounting section are on a same side of the casing;
an ECU mounting frame projects from a wall of the second casing member, and the ECU is disposed on a second surface of the wall of the second casing member adjacent to the relay module mounting section; and
the fuse module and the relay module are arranged on the side of the casing in a vertical direction.

3. The vehicle-mounted electrical junction box according to claim 2,
wherein a power source bus bar is disposed to bridge the fuse and relay modules and the circuit board; and
wherein the power source bus bar is provided with a power source connecting terminal portion, and the power source bus bar is connected through a bus bar of the relay module to input terminals of the some of the relays, to input terminals of some of the fuses to be attached to the fuse module, and to conductors of the circuit board.

4. The vehicle-mounted electrical junction box according to claim 1,
wherein a power source bus bar is disposed to bridge the fuse and relay modules and the circuit board; and
wherein the power source bus bar is provided with a power source connecting terminal portion, and the power source bus bar is connected through bus bars of the relay module to input terminals of the some of the relays, to input terminals of some of the fuses to be attached to the fuse module, and to conductors of the circuit board.

5. The vehicle-mounted electrical junction box according to claim 4,
wherein the relay module includes a substantially L-shaped heat radiation plate disposed on a side opening in the relay module mounting section, a first bus bar of the bus bars of the relay module capable of being connected to the input terminals of the some of the relays, and a second bus bar of the bus bars of the relay module capable of being connected to output terminals of the some of the relays;
wherein the first bus bar includes a vertical portion and a horizontal portion extending from a second end of the vertical portion, a first end of the vertical portion is welded to the power source bus bar, the horizontal portion is attached to a horizontal surface of a second end of the heat radiation plate, and first terminal portions capable of being connected to the input terminals of the some of the relays extend in a vertical direction from an outer side edge of the horizontal portion and are spaced away from one another;
wherein the second bus bar is provided on a second end of the second bus bar with second terminal portions capable of being connected to the output terminals of the some of the relays and on a first end of the second bus bar with third terminal portions to be connected to input terminals of the fuses; and
wherein the fuse module includes a fuse casing provided with fuse containing sections that are juxtaposed in a horizontal direction and are stacked in a plurality of layers in the vertical direction, and a fuse output side bus bar capable of being connected to the conductors of the circuit board and to output terminals of the fuses when the output terminals of the fuses are inserted into the fuse containing sections.

6. The vehicle-mounted electrical junction box according to claim 5,
wherein the power source bus bar is formed into a bent shape, the power source bus bar being provided with (1) first connecting portions capable of being connected to the input terminals of some of the fuses, the first connecting portions being provided on a first end of the power source bus bar, (2) the power source connecting terminal portion and fourth terminal portions to be connected to fusible links, the power source connecting terminal portion and the fourth terminal portions being provided on a second end of the power source bus bar, and (3) a second connecting portion to be welded to a power source connecting portion of the first bus bar, the second connecting portion being provided on a side of an intermediate position of the power source bus bar; and
wherein the power source bus bar is arranged to cover the fuse output side bus bar.

* * * * *